(12) United States Patent
Reznicek et al.

(10) Patent No.: US 10,886,275 B2
(45) Date of Patent: Jan. 5, 2021

(54) NANOSHEET ONE TRANSISTOR DYNAMIC RANDOM ACCESS DEVICE WITH SILICON/SILICON GERMANIUM CHANNEL AND COMMON GATE STRUCTURE

(71) Applicant: INTERNATIONAL BUSINESS MACHINES CORPORATION, Armonk, NY (US)

(72) Inventors: Alexander Reznicek, Troy, NY (US); Karthik Balakrishnan, Scarsdale, NY (US); Bahman Hekmatshoartabari, White Plains, NY (US); Clint Oteri, East Greenbush, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/266,544

(22) Filed: Feb. 4, 2019

(65) Prior Publication Data
US 2020/0251474 A1 Aug. 6, 2020

(51) Int. Cl.
| | |
|---|---|
| *H01L 21/00* | (2006.01) |
| *H01L 27/108* | (2006.01) |
| *H01L 29/10* | (2006.01) |
| *H01L 29/78* | (2006.01) |
| *H01L 29/165* | (2006.01) |

(Continued)

(52) U.S. Cl.
CPC .... *H01L 27/10802* (2013.01); *H01L 29/0673* (2013.01); *H01L 29/1054* (2013.01); *H01L 29/165* (2013.01); *H01L 29/66545* (2013.01); *H01L 29/7841* (2013.01)

(58) Field of Classification Search
CPC .......... H01L 27/10802; H01L 29/1054; H01L 29/7841
See application file for complete search history.

(56) References Cited

U.S. PATENT DOCUMENTS

| | | | | |
|---|---|---|---|---|
| 8,085,594 B2 * | 12/2011 | Okhonin | ............... | G11C 11/404 257/296 |
| 8,264,041 B2 * | 9/2012 | Okhonin | ............... | G11C 11/404 257/347 |

(Continued)

FOREIGN PATENT DOCUMENTS

| | | |
|---|---|---|
| KR | 10-2017-0102660 A | 9/2017 |
| KR | 10-2018-0091143 A | 8/2018 |

OTHER PUBLICATIONS

Lin, J-T et al., "Vertical Transistor With n-Bridge and Body on Gate for Low-Power 1T-DRAM Application" IEEE Transactions on Electron Devices (Dec. 2017) pp. 4937-4945, vol. 64, No. 12.

*Primary Examiner* — Laura M Menz
(74) *Attorney, Agent, or Firm* — Tutunjian & Bitetto, PC.; Daniel Morris

(57) ABSTRACT

A memory device is provided that includes a bilayer nanosheet channel layer including a silicon (Si) layer and a silicon germanium (SiGe) layer; and a common gate structure for biasing each of the silicon layer and the silicon germanium layer of the bilayer nanosheet channel layer to provide one of the silicon layer and the silicon germanium layer is biased in accumulation and one of the first layer and the second layer biased in inversion. The memory devices also includes a floating body region on a front face or rear face of the bilayer nanosheet channel layer.

10 Claims, 8 Drawing Sheets

(51) Int. Cl.
*H01L 29/66* (2006.01)
*H01L 29/06* (2006.01)

(56) References Cited

U.S. PATENT DOCUMENTS

| | | | |
|---|---|---|---|
| 8,508,994 B2* | 8/2013 | Okhonin | G11C 11/404 |
| | | | 365/185.08 |
| 9,419,078 B2* | 8/2016 | Cheng | H01L 21/31111 |
| 9,508,854 B2* | 11/2016 | Biswas | H01L 29/7855 |
| 9,627,512 B2* | 4/2017 | Cheng | H01L 29/66636 |
| 9,773,922 B1* | 9/2017 | Lin | H01L 29/1037 |
| 9,825,183 B2* | 11/2017 | Lee | H01L 29/66545 |
| 9,991,352 B1* | 6/2018 | Frougier | B82Y 10/00 |
| 9,997,519 B1* | 6/2018 | Bao | H01L 29/092 |
| 10,014,390 B1* | 7/2018 | Bouche | H01L 29/0665 |
| 10,381,068 B2* | 8/2019 | Na | H01L 29/775 |
| 2005/0056877 A1* | 3/2005 | Rueckes | H01L 29/0665 |
| | | | 257/300 |
| 2008/0050573 A1* | 2/2008 | Nakano | C01B 33/02 |
| | | | 428/220 |
| 2011/0000698 A1* | 1/2011 | Osada | H01L 21/316 |
| | | | 174/137 B |
| 2015/0221651 A1* | 8/2015 | Toh | H01L 21/02532 |
| | | | 257/192 |
| 2015/0221652 A1* | 8/2015 | Toh | H01L 29/1054 |
| | | | 257/348 |
| 2016/0181250 A1* | 6/2016 | Ramachandran | H01L 29/1054 |
| | | | 257/192 |
| 2017/0044683 A1* | 2/2017 | Cullen | C01B 25/003 |
| 2017/0133513 A1* | 5/2017 | Hong | H01L 29/78684 |
| 2018/0040695 A1* | 2/2018 | Smith | H01L 29/0676 |
| 2018/0061944 A1* | 3/2018 | Cheng | H01L 29/401 |
| 2018/0083113 A1* | 3/2018 | Balakrishnan | H01L 21/02603 |
| 2018/0226484 A1* | 8/2018 | Bao | H01L 29/66772 |
| 2019/0172828 A1* | 6/2019 | Smith | H01L 29/42392 |
| 2019/0189195 A1* | 6/2019 | Na | H01L 27/0924 |
| 2020/0013791 A1* | 1/2020 | Or-Bach | H01L 29/42332 |
| 2020/0127054 A1* | 4/2020 | Ando | H01L 45/1233 |
| 2020/0144388 A1* | 5/2020 | Xie | H01L 21/02532 |

* cited by examiner

NANOSHEET ONE TRANSISTOR DYNAMIC RANDOM ACCESS DEVICE WITH SILICON/SILICON GERMANIUM CHANNEL AND COMMON GATE STRUCTURE

BACKGROUND

Technical Field

The present invention relates in general to memory devices, and in particular to dynamic random access memory (DRAM) devices.

Description of the Related Art

A memory circuit is a collection of storage cells, referred to hereinafter as "bit cells", together with associated circuits needed to transfer information to or from any desired location within the memory circuit. A common type of such a memory circuit is Random Access Memory (RAM). Integrated circuit RAM units are available as one of two general types: static and dynamic. Static RAM consists essentially of internal latches that store binary information. Any information stored in this manner will remain intact as long as power is applied to the unit. The dynamic RAM or DRAM, stores the binary information in the form of electric charges that are stored in capacitors. The capacitors are typically provided inside the integrated circuit by MOS transistors. Because capacitors lose charge over time, DRAM circuits must include logic to refresh (recharge) the RAM devices continuously. While a conventional DRAM is being refreshed, it cannot be read by the processor, thus causing DRAM to be slower than static random access memory devices (SRAMs). Despite being slower, DRAMs are more common utilized than SRAMs because their circuitry is simpler and because they can hold several times as much data per unit area on an integrated circuit.

SUMMARY

In one aspect, the present disclosure provides a memory device, such as a one transistor dynamic random access memory device (1T DRAM) that includes a channel provided by a bilayer nanosheet and a common gate structure.

In one embodiment, the memory device includes a memory device that includes a bilayer nanosheet channel layer including a first layer composed of a silicon containing material and a second layer of a germanium containing material, and a common gate structure for biasing each of the first layer and the second layer of the bilayer nanosheet channel layer to provide that one of the first layer and the second layer is biased in accumulation and one of the first layer and the second layer biased in inversion. The memory device further includes a floating body region on a front face or rear face of the bilayer nanosheet channel layer.

In another embodiment, the memory device includes a bilayer nanosheet channel layer including a silicon (Si) layer and a silicon germanium (SiGe) layer. The memory device further includes a common gate structure for biasing each of the silicon layer and the silicon germanium layer of the bilayer nanosheet channel layer. This provides that the silicon germanium layer is biased in accumulation, and that the silicon layer is biased in inversion. The memory device further includes a floating body region on a front face or rear face of the bilayer nanosheet channel layer.

In another aspect, a method is provided for forming a memory device that includes forming a material stack including a first sacrificial layer on a substrate, a bilayer nanosheet channel layer including a silicon (Si) layer and a silicon germanium (SiGe) layer atop the first sacrificial layer, and a second sacrificial layer atop the bilayer nanosheet channel layer. The method further includes patterning the bilayer nanosheet channel layer using a replacement gate structure having abutting gate sidewall spacers as an etch mask, and forming epitaxial semiconductor material on exposed edges of said bilayer nanosheet channel layer following the patterning. The replacement gate structure and the first and second sacrificial layer may be replaced with a functional gate structure present in direct contact with the bilayer nanosheet channel layer. A floating body region is formed on a front face or rear face of the bilayer nanosheet channel layer.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION

Figure 1A:
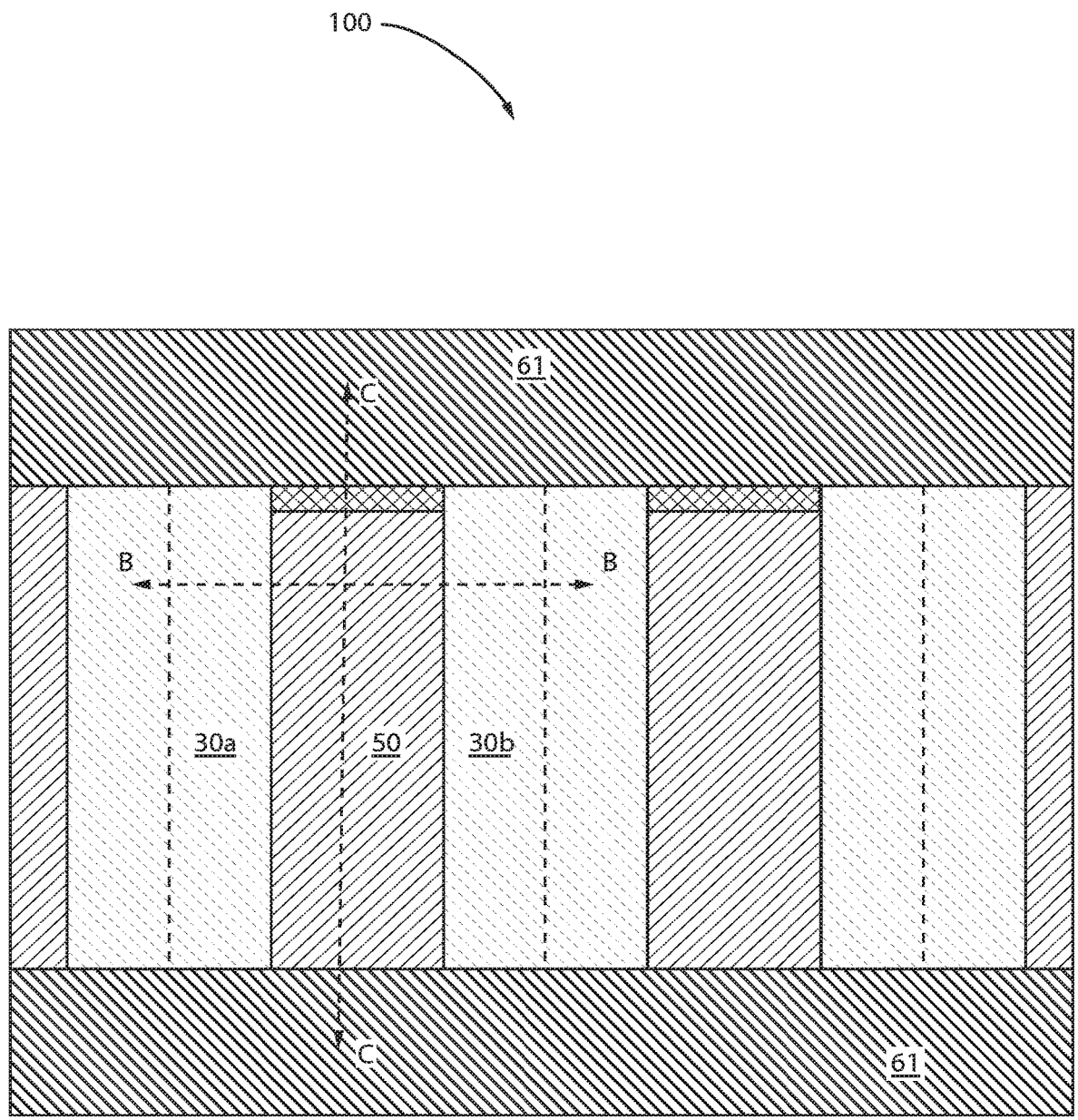
FIG. 1A is a top down view of a memory device that includes a bilayer nanosheet channel layer including a silicon (Si) layer and a silicon germanium (SiGe) layer, a common gate structure for biasing each of the silicon layer and the silicon germanium layer; and a floating body region on a front face or rear face of the bilayer nanosheet channel, in accordance with one embodiment of the present disclosure.

Detailed embodiments of the claimed methods, structures and computer products are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. For purposes of the description hereinafter, the terms "upper", "over", "overlying", "lower", "under", "underlying", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In one aspect, embodiments of the present disclosure describes a memory device, such as a one transistor dynamic random access memory (1T DRAM) floating body memory device, that includes a nanosheet channel layer having a bilayer composition, and a common gate structure to the nanosheet channel. In some examples, one transistor dynamic random access memory (1T DRAM) floating body memory devices are implemented by having two separate gate contacts, and by biasing one side of the channel in inversion and an opposing side of the channel in accumulation. However, this arrangement has been determined to be cumbersome for implementation into many device architectures. In some embodiments, the methods and structures of the present disclosure provides a memory device, such as a one transistor dynamic random access memory (1T DRAM) floating body memory device, that is implemented using only one channel region that is composed of two materials that is referred to as a bilayer, and is in electrical communication with one gate structure. The bilayer that provides the channel region is a nanosheet having two regions of two different semiconductor materials, e.g., a silicon containing material and a germanium containing material. The one gate structure that is in contact with both the two regions of the bilayer channel layer so that the same material compositions are in direct contact with the silicon i.e., the same gate materials bias both materials of the bilayer. In some embodiments, the use of the bilayer nanosheet and the common gate structure allows for one side of the bilayer nanosheet to be biased in inversion, and the other side of the bilayer nanosheet to be biased in accumulation using the same gate structure, i.e., the common gate structure. Further details regarding the method and structures of the present disclosure are now described with reference FIGS. 1A-7.

Figure 1B:
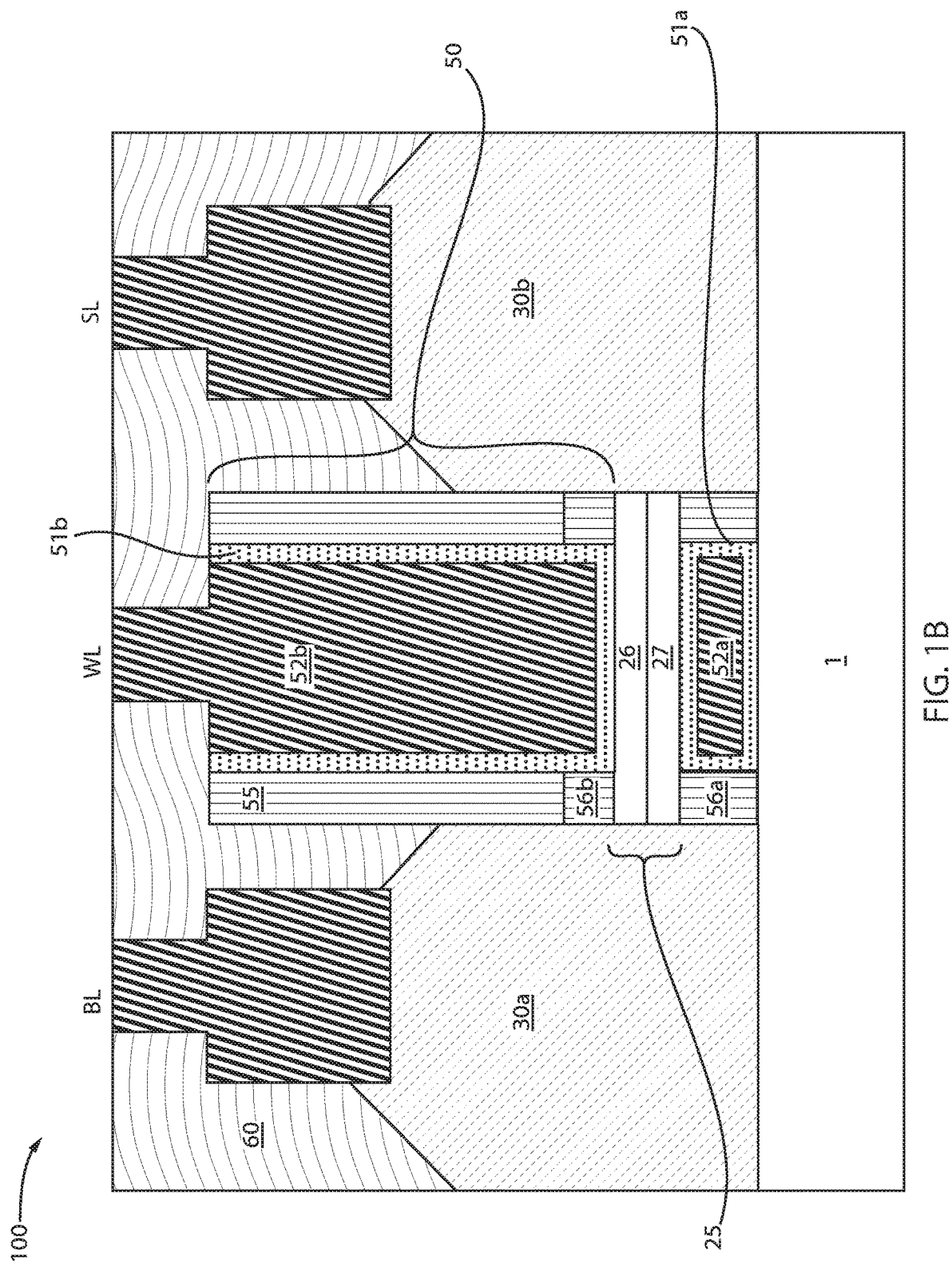
FIG. 1B is a side cross-sectional view along section line B-B of FIG. 1A.
Figure 1C:
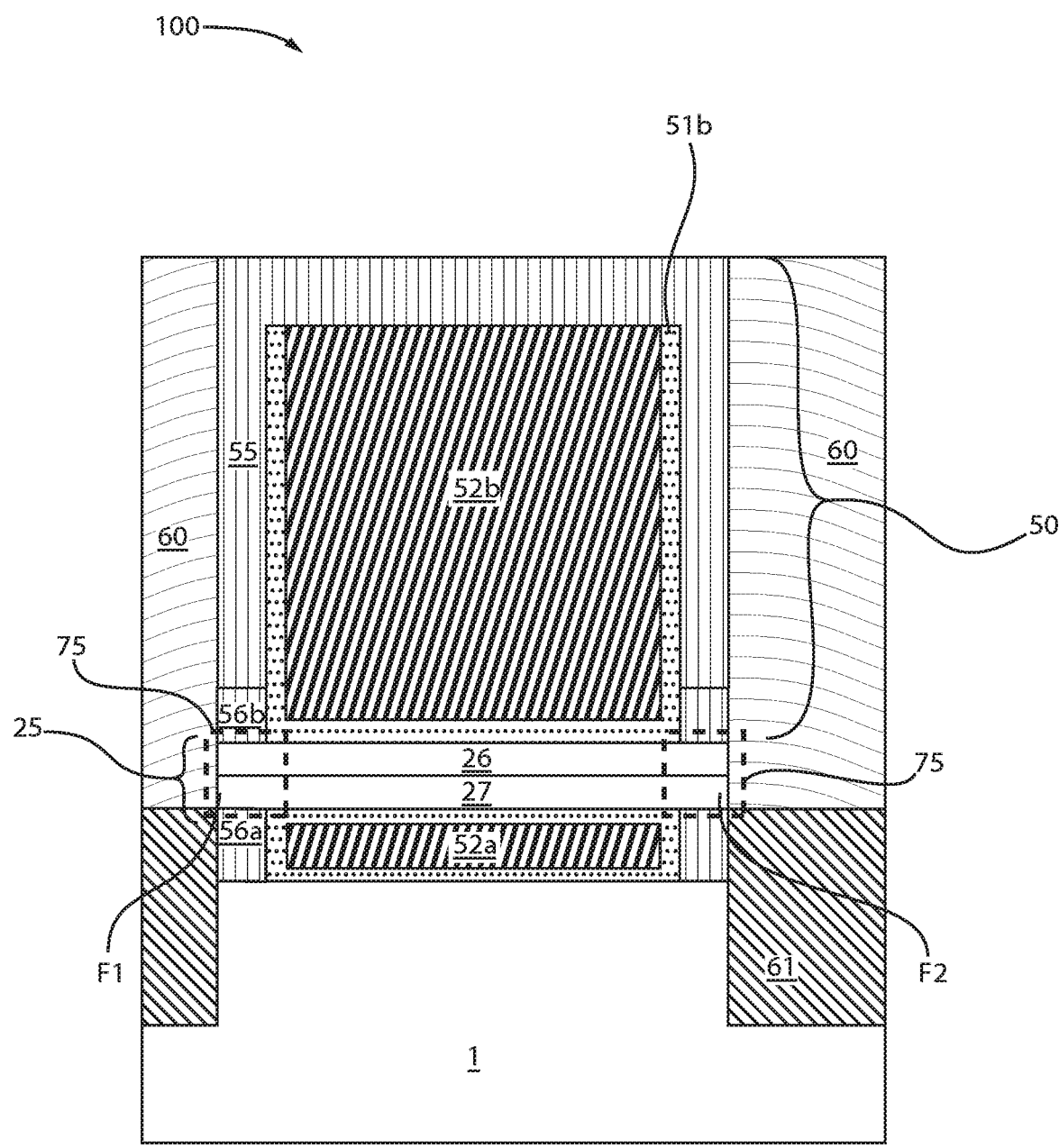
FIG. 1C is a side cross-sectional view along section line C-C of FIG. 1A.

FIGS. 1A-1C illustrate one example of a memory device 100, e.g., one transistor dynamic random access memory (1T-DRAM), that includes bilayer nanosheet channel layer 25, a common gate structure 50, and a floating body region 75. FIG. 1A is a top down view of the memory device. FIG. 1B is a side cross-sectional view along section line B-B of FIG. 1A. FIGS. 2-7 are also side cross-sectionals that are along section line B-B through the process steps for forming the final structure depicted in FIGS. 1A-1C. FIG. 1C is a side cross-sectional view along section line C-C of FIG. 1A.

In one embodiment, the memory device 100 includes a bilayer nanosheet channel layer 25 including a first layer composed of a silicon containing material (also referred to as silicon containing layer 26) and a second layer of a germanium containing material (also referred to as germanium containing layer 27).

The term "nanosheet" denotes a substantially two dimensional structure with thickness in a scale ranging from 1 to 100 nm. The width and length dimensions of the nanosheet may be greater than the width dimensions. Nanosheets 25 are semiconductor material layers that can be employed as suspended channel structures. To provide these structures, stacks of semiconductor material layers are provided in which one of the compositions for a material layer within the stack is sacrificial, i.e., removed, and one of the material layers remains in the structure to provide the nanosheets.

The nanosheets provide the channel of the memory device, e.g., the channel of the transistor for the one transistor dynamic random access memory (1T DRAM) device. As used herein, the term "channel" is the region underlying the gate structure and between the source and drain of a semiconductor device that becomes conductive when the semiconductor device is turned on. By "suspended channel" it is meant that at least one semiconductor material layer is present overlying the substrate 1, wherein the sidewalls of the suspended channel are supported, e.g., anchored, in a structure, such as a spacer 55 abutting the gate structure. Gate structure materials, electrically conductive materials and/or semiconductor materials may be formed in the space surrounding the suspended structures.

The term "bilayer" as used to describe the nanosheet channel layer 25 denotes that the bilayer nanosheet channel layer 25 includes two material layers having different compositions. For example, the bilayer nanosheet channel layer 25 includes a silicon containing layer 26 and a germanium containing layer 27. The term "silicon containing layer" denotes a semiconductor material layer comprising greater than 50 at. % silicon (Si). For example, the silicon containing layer 26 may be composed of silicon (Si) e.g., substantially 100 at. % silicon (Si). The silicon containing layer 26 may be crystalline, e.g., monocrystalline silicon. The term "germanium containing layer" denotes a semiconductor material layer having greater than 5 at. % germanium (Ge). For example, the germanium containing layer 27 may be silicon germanium having 20 at. % germanium (Ge), or greater. The germanium containing layer 27 may be crystalline, e.g., single crystalline silicon germanium. As will be described herein, the silicon containing layer 26 and the germanium containing layer 27 may each be formed using an epitaxial deposition process. In some embodiments, the memory device 100 includes a first layer of the bilayer nanosheet is the silicon containing layer 26 having a thickness ranging from 1 nm to 50 nm, and the second layer of the bilayer nanosheet is the germanium containing layer 27 having a thickness ranging from 1 nm to 50 nm.

In some embodiments, the memory device 100 includes a common gate structure 50 for biasing each of the first layer 26 and the second layer 27 of the bilayer nanosheet channel layer 25 to provide one layer of the bilayer nanosheet channel layer 25 that is biased in accumulation and one layer of the bilayer nanosheet channel layer 25 that is biased in inversion. In some embodiments, the germanium containing layer 27, e.g., silicon germanium layer, is biased in accumulation; and that the silicon containing layer 26, e.g., silicon layer is biased in inversion. For n-channel transistors, accumulation occurs for negative gate-to-source voltages where the negative charge on the gate attracts holes to the gate dielectric-channel interface. Inversion occurs at voltages beyond (e.g. more positive than) the threshold voltage. In inversion, there exists a negatively charged inversion layer at the gate dielectric-channel interface. This inversion layer is due to electrons, which are attracted to the interface by the positive gate-to-source voltage. For p-channel transistors, accumulation occurs for positive gate-to-source voltages where the positive charge on the gate attracts electrons to the gate dielectric-channel interface. Inversion occurs at voltages below (e.g. more negative than) the threshold voltage. In inversion, there exists a positively charged inversion layer at the gate dielectric-channel interface. This inversion layer is due to holes, which are attracted to the interface by the negative gate-to-source voltage.

In some embodiments, the present disclosure provides an asymmetric channel nanostructure between the top to bottom of the channel, which results from the different compositions of the silicon containing layer 26 and the germanium containing layer 27 of the bilayer nanosheet channel layer 25, induces a threshold voltage difference between the two different sides of the bilayer nanosheet channel layer 25. As used herein, "threshold voltage" is the lowest (in terms of absolute value) attainable gate-to-source voltage that will turn on a semiconductor device, e.g., transistor, by making the channel of the device conductive. In one example, the threshold voltage difference between the two different sides of the bilayer nanosheet channel 25 may be greater than 250 mV. In another example, the threshold voltage difference between the two different sides of the bilayer nanosheet channel 25 may be greater than 500 mV. In some examples, the threshold voltage difference between the two different sides of the bilayer nanosheet channel 25 may be equal to 400 mV, 450 mV, 500 mV, 550 mV, 600 mV, 650 mV, 700 mV, 750 mV, 800 mV, 900 mV, and 1000 mV, as well as any range of values having a lower limit provided by one of the aforementioned examples and an upper limit provided by one of the aforementioned examples. Further, the threshold voltage difference may be any value within the aforementioned ranges.

The common gate structure 50 is a functional gate structure that operates to switch the semiconductor device from an "on" to "off" state, and vice versa. The common gate structure 50 provides a single gate electrode 52a, 52b to bias the two sides of the bilayer nanosheet channel 25 in accumulation and inversion. In some embodiments, the single gate electrode 52a, 52b wraps around the bilayer nanosheet channel 25. An upper portion 52a of the single gate electrode 52a, 52b is in direct contact with the silicon containing layer 26 of the bilayer nanosheet channel 25 through an upper portion 51b of the gate dielectric 51a, 51b; and a lower portion 52b of the single gate electrode 52a, 52b is in direct contact with the germanium containing layer 27 of the bilayer nanosheet channel 25 through a lower portion 51a of the gate dielectric 51a, 51b.

In some embodiments, the upper portion of common gate structure 50 when viewed from a side cross-section includes an upper portion 51b of the gate dielectric 51a, 51b having a U-shaped geometry in direct contact with the silicon containing layer 26, and an upper portion 52b of the gate electrode 52a, 52b in direct contact with the upper portion 51b of the gate dielectric 51a, 51b. The thickness of the upper portion 51b of the gate dielectric 51a, 51b has a conformal thickness. The term "conformal" denotes a layer having a thickness that does not deviate from greater than or less than 30% of an average value for the thickness of the layer.

In some embodiments, the common gate structure 50 includes a second portion underlying the germanium containing layer 27 of the bilayer nanosheet channel 25. The second portion of the common gate structure 50 includes a continuous conformal gate dielectric layer 51a including portions present on the second layer of the germanium containing material 27, the interior sidewalls of the gate sidewall spacer 55 and the supporting substrate 1. The continuous conformal gate dielectric layer 51 being the lower portion 51a of the gate structure. The continuous conformal gate dielectric layer 51a of the gate dielectric 51a, 51b providing a rectangular geometry around a lower power 52a of the gate electrode 52a, 52b.

Although FIG. 1A depicts that the lower portion and the upper portion of the common gate structure 50 as separate structures, the lower portion and the upper portion of the common gate structure 50 are a singular structure, in which the upper and lower portions of gate dielectric 51a, 51b have the same material, and the upper and lower portions of the gate electrode 52a, 52b have the same material. The common gate structure 50 wraps around the bilayer nanosheet channel layer 25.

The gate dielectric layer 51a, 51b may comprise a semiconductor oxide, semiconductor nitride, semiconductor oxynitride, or a high k material having a dielectric constant greater than silicon oxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2ON_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, the gate dielectric layer 51a, 51b may have a thickness ranging from about 1.0 nm to about 6.0 nm.

In some embodiments, the gate electrode 52a, 52b of the common gate structure 50 may be composed of a metal, such as a high work function metal and/or a low work function metal. In one embodiment, the work function of the high work function metal layer ranges from 4.9 eV to 5.2 eV. In one embodiment, the high work function metal is composed of titanium nitride (TiN). In some embodiments, the high work function metal may be composed of TiAlN, Ru, Pt, Mo, Co and alloys and combinations thereof. In one embodiment, the work function of the low work function metal ranges from 4.1 eV to 4.3 eV. In one embodiment, the low work function metal is composed of at least one of TiAl, TaN, TiN, HfN, HfSi, or combinations thereof.

In some other embodiments, the gate electrode (also referred to as gate conductor) 52a, 52b may be composed of doped semiconductor, e.g., n-type polysilicon or p-type polysilicon. Increasing the work function of the gate electrode increases the threshold voltage (e.g. to more positive values for n-channel transistors and to less negative values for p-channel transistors); whereas reducing the workfunction of the gate electrode decreases the threshold voltage (e.g. to less positive values for n-channel transistors and to more negative values for p-channel transistors).

Referring to FIGS. 1A-1C, the memory device 100 further includes n-type or p-type epitaxial semiconductor material 30a, 30b that is present on opposing sides of the bilayer nanosheet channel layer 25. The epitaxial semiconductor material 30a, 30b provides the source and drain regions of the memory device 100.

In some embodiments, the epitaxial semiconductor material may be composed of silicon (Si), germanium (Ge), silicon germanium (SiGe), silicon doped with carbon (Si:C) or the epitaxial semiconductor material 35 may be composed of a type III-V compound semiconductor, such as gallium arsenide (GaAs).

As used herein, "p-type" refers to the addition of impurities to an intrinsic semiconductor that creates deficiencies of valence electrons. For example, in a type IV semiconductor material, such as silicon (Si), germanium (Ge) or silicon germanium (SiGe), examples of p-type dopants, i.e., impurities, include but are not limited to: boron, aluminum, gallium and indium. As used herein, "n-type" refers to the addition of impurities that contributes free electrons to an intrinsic semiconductor. For example, in a type IV semiconductor, such as a silicon (Si), germanium (Ge), and silicon germanium (SiGe), examples of n-type dopants, i.e., impurities, include but are not limited to antimony, arsenic and phosphorous.

The source and drain regions may be composed of epitaxial semiconductor material. The term "epitaxial semiconductor material" denotes a semiconductor material that has been formed using an epitaxial deposition or growth process. As further described below when describing a method of forming a memory device, the term "epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

Still referring to FIGS. 1A-1C, the gate sidewall spacer 55 that is present between the common gate structure 50 and the epitaxial semiconductor material 30a, 30b that provides the source and drain regions of the device have a first portion overlying the bilayer nanosheet channel layer 25 at an interface between the bilayer nanosheet channel layer 25, and the n-type or p-type epitaxial semiconductor material 30a, 30b and a second portion underlying the bilayer nanosheet channel layer 25. The gate sidewall spacer 25 also includes a dielectric material, such as a nitride, e.g. silicon nitride, or an oxide, such as silicon oxide.

Referring to FIGS. 1A and 1C, in some embodiments, the memory device 100 includes a floating body region 75. A floating body region 75 stores an information bit in the form of an electric charge. The floating body region 75 is charged and discharged via an access transistor, e.g., the one transistor (1T) of the dynamic random access memory (DRAM), during data write operations.

In some embodiments, the floating body region 75 can be a portion of the bilayer nanosheet channel layer 25. The portion of the bilayer channel layer 25 which is under the gate structure, e.g., common gate structure 50, functions as the channel, and the portion of the bilayer channel layer 25 that is positioned beneath the gate sidewall spacers 55 is the floating body region 75. In the embodiment depicted in FIGS. 1A-1C, the floating body regions 75 of the bilayer channel layer is in direct contact with an interlevel dielectric layer 60, in which the interlevel dielectric layer 60 passivates the ends of the bilayer channel layer at which the floating body regions 75 are present.

The floating body region 75 is on a front face F1 or rear face F2 of the bilayer nanosheet channel layer 25. The front face F1 and rear face F2 are the opposing faces of the channel 25 that are present between the epitaxial semiconductor material 30a, 30b. The epitaxial semiconductor material 30a, 30b that provides the source and drain regions of the device are present on the opposing edges of the nanosheet channel 25. The front and rear faces F1, F2 extend along a dimension that is equal to the dimension separating the source and drain regions, i.e., epitaxial semiconductor material 30a, 30b.

Referring to FIG. 1A, contacts BL, WL, SL may be formed to the memory device 100 through an interlevel dielectric layer (ILD) 60 that is overlying the device. The interlevel dielectric layer 60 may be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). An isolation region 61, e.g., an isolation region 61 composed of a dielectric, such as an oxide, e.g., silicon oxide, may be present under the interlevel dielectric layer 60.

Vias are formed through the interlevel dielectric layer 60 to provide openings to the epitaxial semiconductor material 30a, 30b and the common gate structure 50. The interconnects are composed of a conductive metal that may include, but is not limited to: tungsten, copper, aluminum, silver, gold and alloys thereof. A bit line (BL) contact is formed to one of the epitaxial semiconductor material 30a, e.g., the source region. A select line (SL) contact is formed to one of the epitaxial semiconductor material 30b, e.g., the drain region. A word line (WL) contact is formed to the common gate structure 50.

Figure 2:
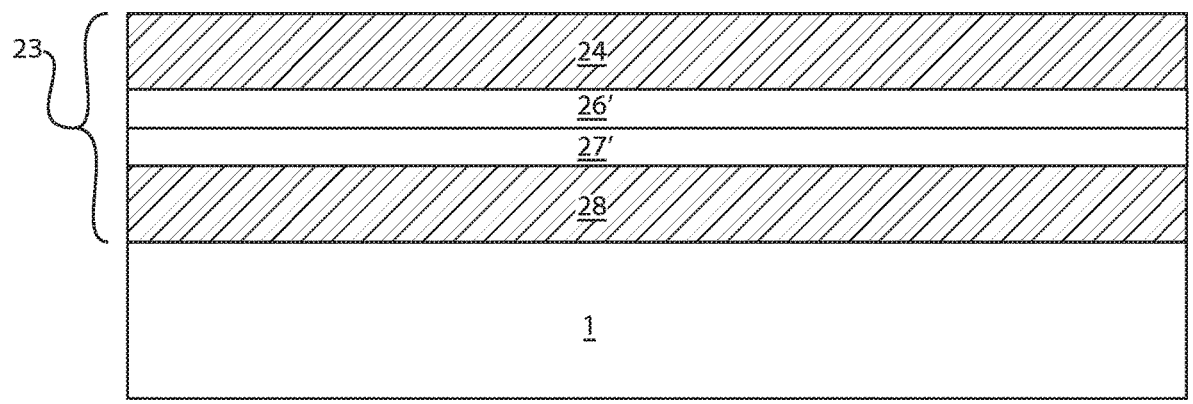
FIG. 2 is a side cross-sectional view depicting a material stack that can be used in a method for forming a memory device including a bilayer nanosheet channel layer and a common gate structure, the material stack including a silicon containing layer and a germanium containing layer atop the first sacrificial layer, and a second sacrificial layer atop the bilayer nanosheet channel layer, in accordance with one embodiment of the present disclosure.

FIGS. 2-7 depict one embodiment of a method for forming a memory device 100, which in some embodiments may be the memory structures 100 depicted in FIGS. 1A-1C. FIG. 2 depicts a material stack 23 that can be used in a method for forming a memory device 100 including a bilayer nanosheet channel layer 25 and a common gate structure 50. The material stack 23 may include a silicon containing layer 26' and a germanium containing layer 27' atop a first sacrificial layer 28, and a second sacrificial layer 24 atop the bilayer nanosheet channel layer 25. The silicon containing layer 26' and the germanium containing layer 27' of the material stack 23 is subsequently processed to provide the silicon containing layer 26 and the germanium containing layer 27 of the bilayer nanosheet channel layer 25 that is depicted in FIGS. 1A-1C. Therefore, the description of the composition for the silicon containing layer 26 and the germanium containing layer 27 for the bilayer nanosheet channel layer 25 is suitable for describing the composition of the silicon containing layer 26' and the germanium containing layer 27' of the material stack 23. In some embodiments, the first and second sacrificial layer 28, 24 of the material stack 23 are comprised of silicon germanium (SiGe). For example, the first and second sacrificial layers 28, 24 are comprised of silicon germanium (SiGe) having a germanium (Ge) at. % of 50% or greater. The first and second sacrificial layers 28, 24 may each have a thickness ranging from 1 nm to 50 nm. Similar to the silicon containing layer 26' and the germanium containing layer 27', the first and second sacrificial layers 28, 24 may be nanosheets.

Each of the first sacrificial layer 28, the germanium containing layer 27', the silicon containing layer 26' and the first and second sacrificial layers 28, 24 may be formed using an epitaxial deposition process. In one embodiment, a number of different sources may be used for the epitaxial deposition of the epitaxial semiconductor material. Examples of silicon including source gasses may include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of germanium including source gasses for epitaxially forming an undoped epitaxial semiconductor material of a germanium containing semiconductor include germane, digermane, halogermane, dichlorogermane, trichlorogermane, tetrachlorogermane and combinations thereof. Epitaxial deposition may be carried out in a chemical vapor deposition apparatus, such as a metal organic chemical vapor deposition (MOCVD) apparatus or a plasma enhanced chemical vapor deposition (PECVD) apparatus.

Figure 3:
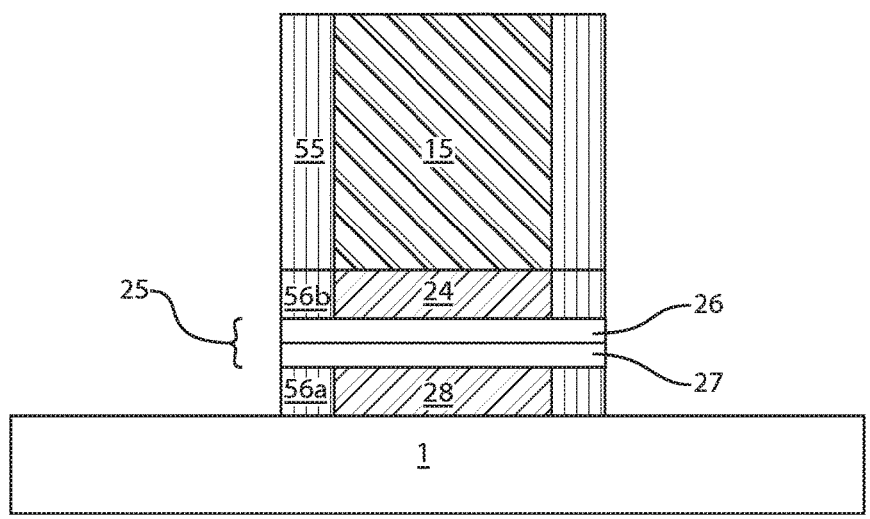
FIG. 3 is a side cross-sectional view depicting patterning the bilayer nanosheet channel layer using a replacement gate structure having abutting gate sidewall spacers as an etch mask.

FIG. 3 depicts patterning the material stack 23 to provide the bilayer nanosheet channel 25 using a replacement gate structure 15 having the abutting gate sidewall spacers 55 as an etch mask. The process flow may continue with forming a replacement gate structure 15 on a channel portion of the material stack 23. By "replacement" it is meant that the structure is present during processing of the memory device 100, but is removed from the memory device 100 prior to the device being completed. The replacement gate structure 15 is a sacrificial structure that dictates the geometry and location of the later formed functioning gate structure, i.e., common gate structure 50.

In one embodiment, the sacrificial material that provides the replacement gate structure 15 may be composed of any material that can be etched selectively to the at least one of the material layers in the material stack 23. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater, e.g., 1000:1.

In one embodiment, the replacement gate structure 15 may be composed of a silicon-including material, such as polysilicon. In another embodiment, the replacement gate structure 15 may be composed of a dielectric material, such as an oxide, nitride or oxynitride material, or amorphous carbon. The replacement gate structure 15 may be formed using deposition (e.g., chemical vapor deposition) photolithography and etch processes (e.g., reactive ion etching). The portion of the bilayer channel layer that is underlying the replacement gate structure 15 is ultimately positioned underlying the common gate structure 50, and therefore functions as a channel region.

A gate sidewall spacer 55 is formed on the sidewall of the replacement gate structure 15. The gate sidewall spacer 55 may be composed of a dielectric material, such as an oxide, nitride, or oxynitride material. The gate sidewall spacer 55 may be formed using a deposition process, such as chemical vapor deposition (CVD), and an anisotropic etch back method. The portion of the bilayer channel layer that is present under the gate sidewall spacer 55 provides the floating body regions 75.

Following the formation of the replacement gate structure 15, the exposed portions of the material stack 23 that extends beyond the replacement gate structure 15 is removed by an anisotropic etch process. The term "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation. At this point of the method, the outer sidewalls of the first sacrificial layer 28, the germanium containing layer 27, the silicon containing layer 26 and the second sacrificial layer 24 may be substantially aligned to the outer sidewall of the gate sidewall spacer 55.

The method may continue with a lateral etch process to remove portions of the first and second sacrificial layers 28, 24. For example, the lateral etch process can remove a portion of the first sacrificial layer 24 underlying the germanium containing layer 27 to provide a first undercut region, and can remove a portion of the second sacrificial layer 24 to provide a second undercut region underlying the silicon containing layer 26. The lateral etch process may be selective to the gate sidewall spacer 55 and the bilayer nanosheet channel layer 25. The lateral etch process may be a dry etch, such as a gas etch and/or plasma etch, and/or the lateral etch process may be a wet etch, such as a chemical etch.

The first and second undercut region may be filled with a underfill spacer 56a, 56b. The underfill spacer 56a, 56b may be formed using a deposition process in combination with an etch process. The underfill spacer 56a, 56b may be composed of a dielectric material, such as an oxide, nitride, or oxynitride material. The underfill spacer 56a, 56b may be formed using a deposition process, and an anisotropic etch back method. The deposition process for filling the undercut regions may be a chemical vapor deposition (CVD) process, such as plasma enhanced chemical vapor deposition (PECVD), and/or atomic layer deposition (ALD). The anisotropic etch process may remove any material for the underfill spacer 56a, 56b that extends outside the undercut regions. The anisotropic etch process may be provided by reactive ion etching (RIE). The gate sidewall spacers 55 and the replacement gate structure 15 function as an etch mask during the formation of the underfill spacer 56a, 56b. Following the etch process, the only semiconductor material of the original material stack 23 that is exposed is the sidewalls of the bilayer nanosheet channel 25.

Figure 4:
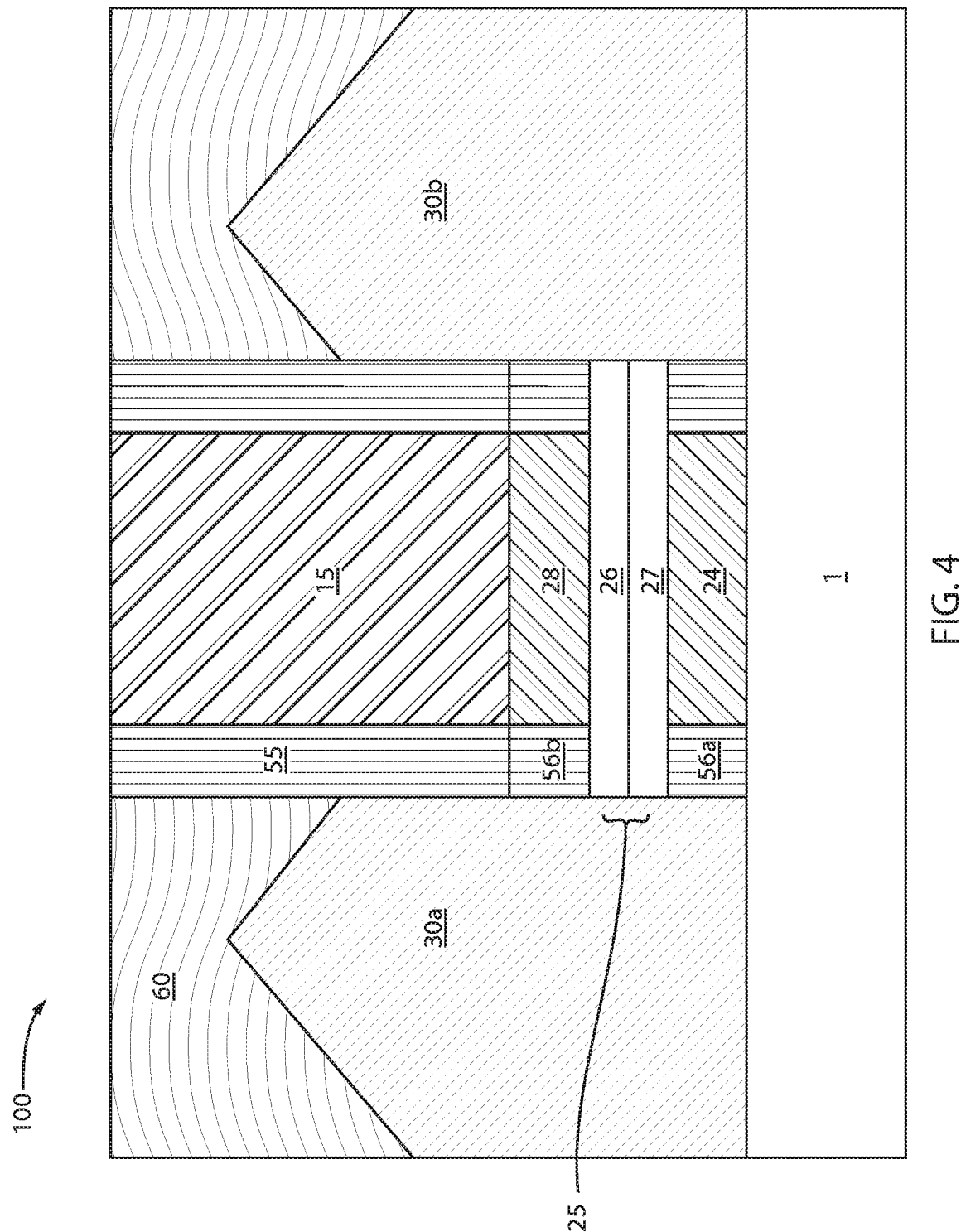
FIG. 4 is a side cross-sectional view depicting forming epitaxial semiconductor material on exposed edges of said bilayer nanosheet channel layer following said patterning.

FIG. 4 depicts forming epitaxial semiconductor material 30a, 30b on exposed edges of the bilayer nanosheet channel 25 following the patterning step and the forming of the underfill spacer 56a, 56b that is described with reference to FIG. 3. At least a portion of the epitaxial semiconductor material 30a, 30b grows from the etched sidewall surface of the semiconductor material layers, i.e., nanosheets, that provide the bilayer nanosheet channel 25. In some embodiments, the epitaxial semiconductor material 30a, 30b may be composed of silicon (Si), germanium (Ge), silicon germanium (SiGe), silicon doped with carbon (Si:C) or the epitaxial semiconductor material 30a, 30b may be composed of a type III-V compound semiconductor, such as gallium arsenide (GaAs).

Epitaxial deposition may be carried out in a chemical vapor deposition apparatus, such as a metal organic chemical vapor deposition (MOCVD) apparatus or a plasma enhanced chemical vapor deposition (PECVD) apparatus. The epitaxial semiconductor material may be in situ doped to a p-type or n-type conductivity. The term "in situ" denotes that a dopant, e.g., n-type or p-type dopant, is introduced to the base semiconductor material, e.g., silicon or silicon germanium, during the formation of the base material. For example, an in situ doped epitaxial semiconductor material may introduce n-type or p-type dopants to the material being formed during the epitaxial deposition process that includes n-type or p-type source gasses. In the embodiments in which the semiconductor device being formed has p-type source and drain regions, and is referred to as a p-type semiconductor device, the doped epitaxial semiconductor material 35 is doped with a p-type dopant to have a p-type conductivity. In a type IV semiconductor, such as silicon, examples of p-type dopants, i.e., impurities, include but are not limited to, boron, aluminum, gallium and indium. In a type IV semiconductor, such as silicon, examples of n-type dopants, i.e., impurities, include but are not limited to antimony, arsenic and phosphorous. In one embodiment, the n-type gas dopant source may include arsine ($AsH_3$), phosphine ($PH_3$) and alkylphosphines, such as with the empirical formula $R_xPH_{(3-x)}$, where R=methyl, ethyl, propyl or butyl and x=1, 2 or 3. Alkylphosphines include trimethylphosphine (($CH_3)_3P$), dimethylphosphine (($CH_3)_2PH$), triethylphosphine (($CH_3CH_2)_3P$) and diethylphosphine (($CH_3CH_2)_2PH$). The p-type gas dopant source may include diborane ($B_2H_6$).

Following the formation of the epitaxial semiconductor material 30a, 30b for the source and drain regions, an interlevel dielectric (ILD) layer 60 may be blanket deposited atop the memory device 100. The interlevel dielectric (ILD) layer 60 may be deposited using chemical vapor deposition, spin on deposition, and/or deposition from chemical solution. The interlevel dielectric (ILD) layer 60 that is depicted in FIG. 3 has been described above with reference 1B and 1C. The portion of the bilayer channel layer that is positioned beneath the gate sidewall spacers 55 and in direct contact with the interlevel dielectric layer (ILD) 60 is the floating body region 75. The interlevel dielectric layer 60 passivates the ends of the bilayer channel layer at which the floating body regions 75 are present.

Figure 5:
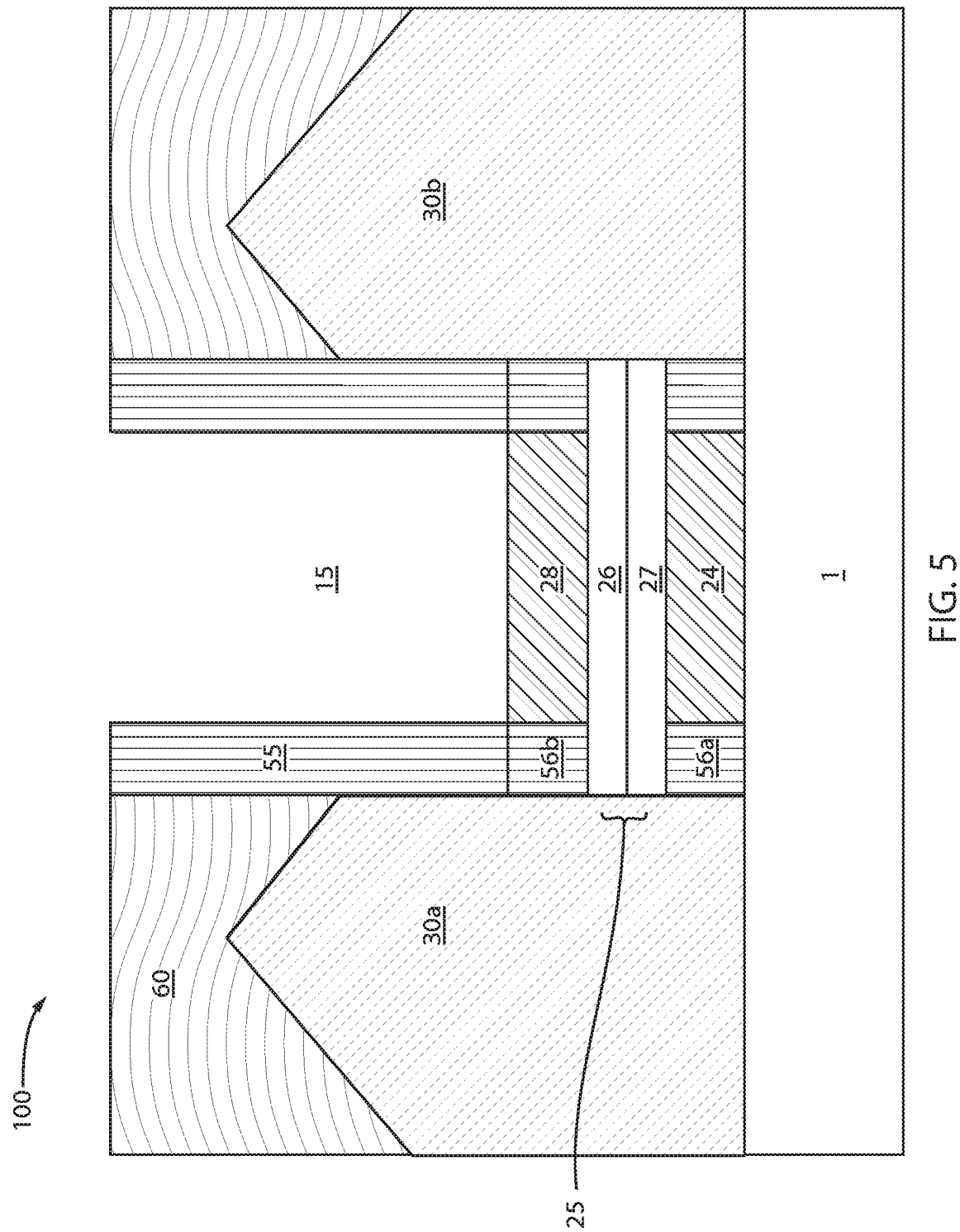
FIG. 5 is a side cross-sectional view depicting one embodiment of removing the replacement gate structure.

FIG. 5 depicts one embodiment of removing the replacement gate structure 15. In some embodiments, removing the replacement gate structure 15 may begin with planarizing the interlevel dielectric layer 60 to expose an upper surface of the replacement gate structure 15. The replacement gate structure 15 may be removed using a wet or dry etch process. In one embodiment, the replacement gate structure 15 may be removed by at least one of an anisotropic etch process, such as reactive ion etch (RIE), or an isotropic etch process, such as a wet chemical etch. In one example, the etch process for removing the replacement gate structure 15 can include an etch chemistry for removing the replacement gate structure 15 that is selective to the material layers of the remaining portions of the material stack 23, e.g., the replacement gate structure 15 may be removed selectively to the second sacrificial layer 24, i.e., upper sacrificial layer. Removing the replacement gate structure 15 produces a gate opening that exposes a channel portion of the material stack 23 that are processed to provide the bilayer nanosheet channel 25.

Figure 6:
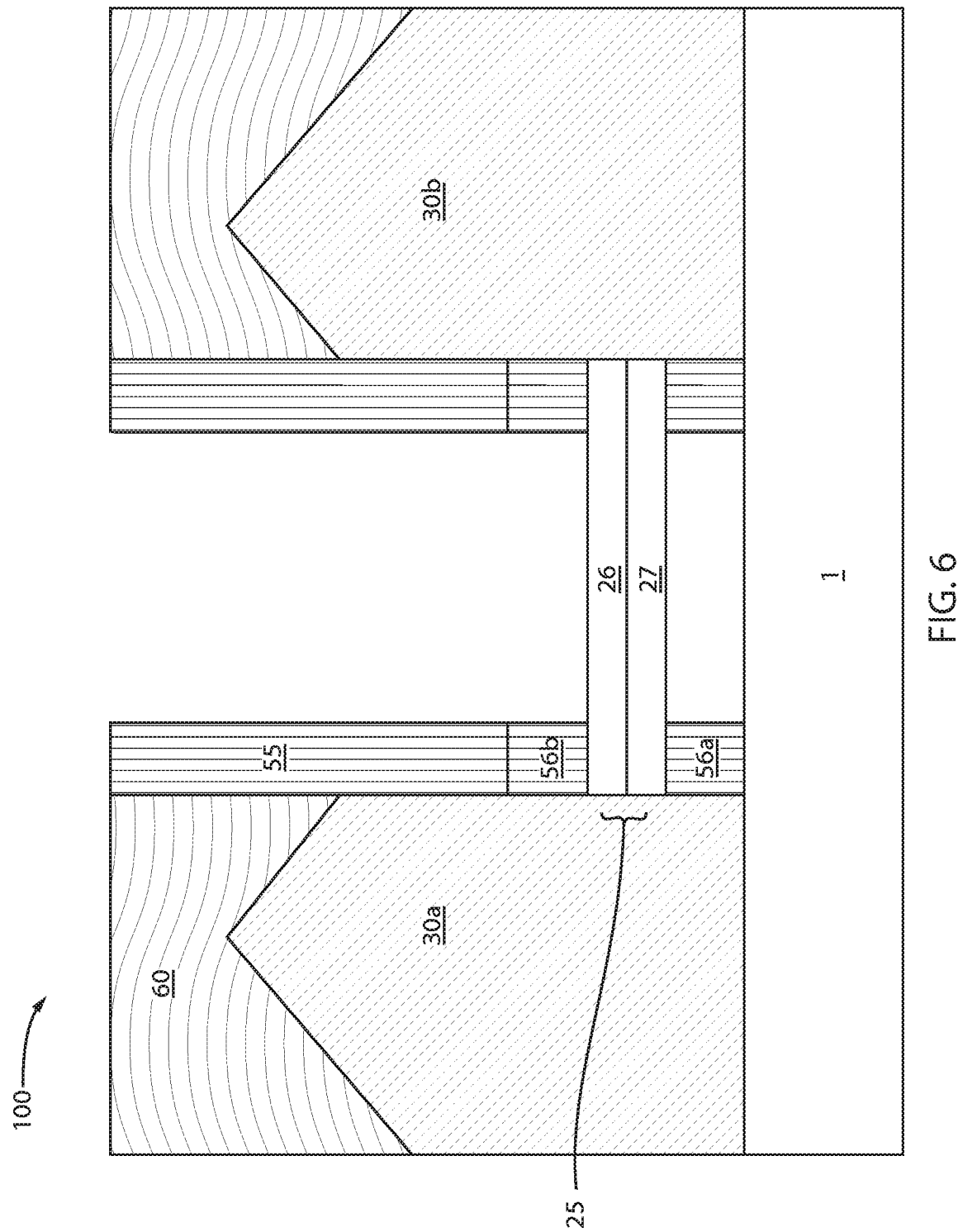
FIG. 6 is a side cross-sectional view depicting one embodiment of removing the first and second sacrificial layers selectively to the silicon containing layer and the germanium containing layer of the bilayer nanosheet channel layer, in accordance with one embodiment of the present disclosure.

FIG. 6 depicts one embodiment of removing the first and second sacrificial layers 28, 24 selectively to the silicon containing layer 26 and the germanium containing layer 27 of the bilayer nanosheet channel layer 25. In some embodiments, the first and second sacrificial layers 28, 24 of the stacks is removed selectively to at least the silicon containing layer 26 and the germanium containing layer 27 of the bilayer nanosheet channel 25 that provides a suspended channel structure. For example, in one embodiment when the first and second sacrificial material layers 28, 24 of the material stack is composed of silicon germanium (SiGe) having 50 at. % germanium (Ge), the silicon containing layer 26 is composed of 100 at. % silicon (Si), and germanium containing layer 27 is composed of 20 at. % germanium (Ge), the first and second sacrificial material layers 28, 24 may be removed selectively to the silicon containing layer 26 and the germanium containing layer 27 with an etch process, such as a wet chemical etch.

Following removal of one of the material layers of the stack, e.g., removal of the first and second sacrificial material layers 28, 24, a suspended channel structure is provided, as depicted in FIG. 6. By "suspended channel" it is meant that at least one semiconductor material layer, i.e., the bilayer nanosheet channel layer 25 of the silicon containing layer 26 and the germanium containing layer 27, is present overlying the substrate 1, wherein the sidewalls of the suspended channel are supported, e.g., anchored, in the gate sidewall spacer 55. Gate structure materials, e.g., the common gate structure 50, of electrically conductive materials and/or semiconductor materials may be formed in the space surrounding the suspended structures.

Figure 7:
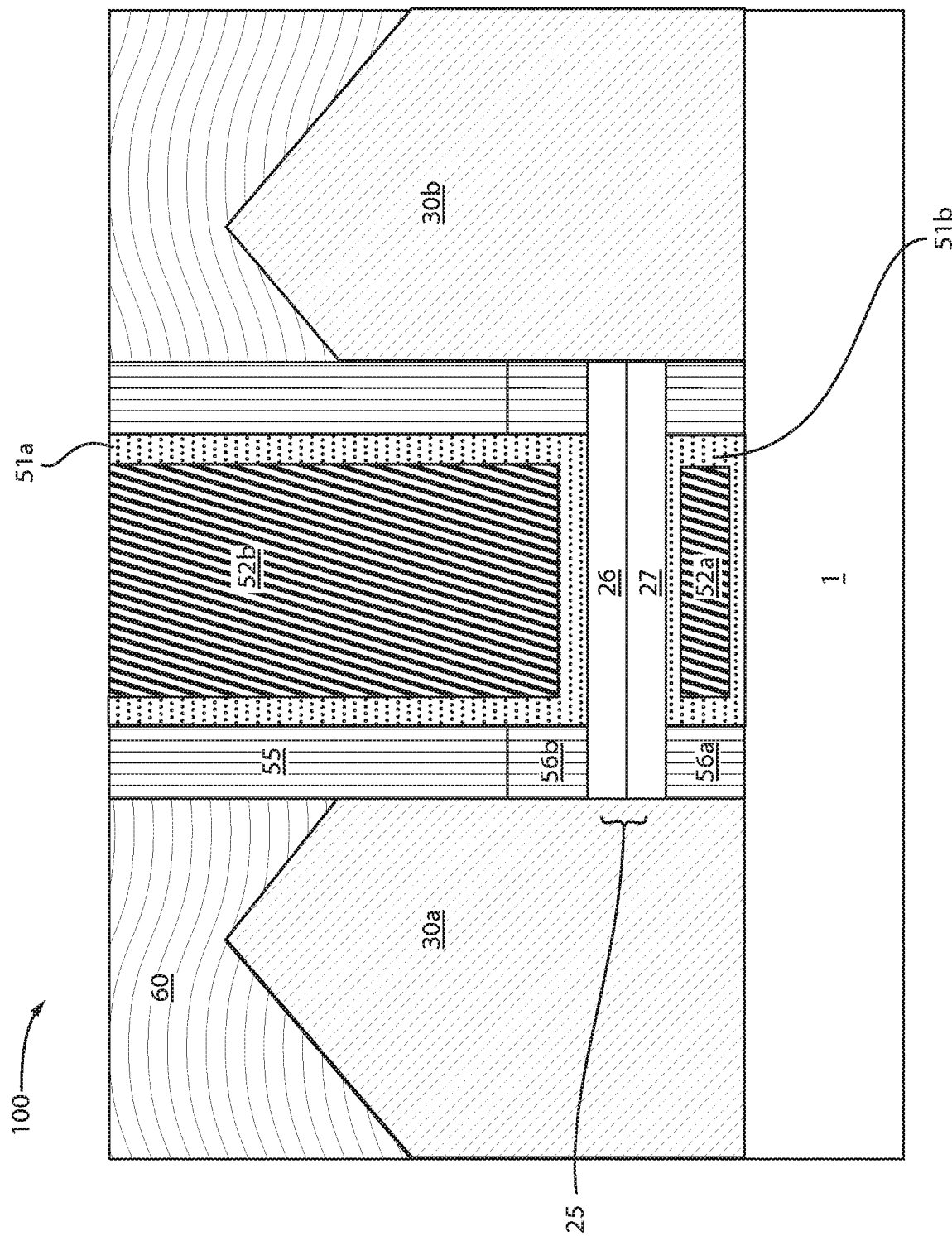
FIG. 7 is a side cross-sectional view depicting forming a common gate structure in direct contact with the bilayer nanosheet channel layer, in accordance with one embodiment of the present disclosure.

FIG. 7 depicts forming a common gate structure 50 in direct contact with the bilayer nanosheet channel layer 25. The method may continue with depositing a gate dielectric 51a, 51b for the common gate structure 50 on the bilayer nanosheet channel layer 25 within the gate opening. The common gate structure 50 may be formed by first depositing at least one gate dielectric 51a, 51b on the bilayer nanosheet channel layer 25 followed by filling the void, i.e., the gate opening, with at least one gate conductor 52a, 52b that is deposited on the at least one gate dielectric 51a, 51b. The gate dielectric 51a, 51b can be formed on the entirety of the exterior surface of the nanosheets, i.e., the silicon containing layer 26 and the germanium containing layer 27, of the bilayer nanosheet channel layer 25.

The gate dielectric 51a, 51b may be deposited using atomic layer deposition (ALD). Atomic Layer Deposition (ALD) uses self-limiting surface reactions to deposit material layers in the monolayer or sub-monolayer thickness regime. ALD is similar in chemistry to chemical vapor deposition (CVD), except that the ALD reaction breaks the CVD reaction into two half-reactions, keeping the precursor materials separate during the reaction. In some embodiments, the atomic layer deposition (ALD) process may be a thin film deposition method in which a film is grown on a deposition surface by exposing the surface to alternate gaseous species (typically referred to as precursors). In contrast to chemical vapor deposition, the precursors are never present simultaneously in the reactor, but they are inserted as a series of sequential, non-overlapping pulses. In each of these pulses, the precursor molecules react with the surface in a self-limiting way, so that the reaction terminates once all the reactive sites on the surface are consumed. In some embodiments, the monolayer deposition provided by the atomic layer depositions mechanisms provides that the layer be conformal.

The at least one gate dielectric 51a, 51b can also be formed by chemical vapor deposition (CVD), such as plasma enhanced chemical vapor deposition (PECVD), metal organic chemical vapor deposition (MOCVD), or atomic layer deposition (ALD). In another embodiment, the at least one gate dielectric 51a, 51b can be formed using thermal growth methods, such as oxidation.

Following the formation of the at least one gate dielectric 51a, 51b, the gate electrode 52a, 52b may be deposited on the at least one gate dielectric 51a, 51b filling the gate opening that is provide by removing the replacement gate structure 15. In one embodiment, the gate electrode 52a, 52b of the common gate structure 50 may be deposited using at least one of physical vapor deposition (PVD), chemical vapor deposition (CVD) or atomic layer deposition (ALD). In one embodiment, the physical vapor deposition (PVD) method for forming the gate electrode 52a, 52b may be sputtering. Examples of sputtering apparatus that may be suitable for depositing the gate electrode 52a, 52b may include DC diode type systems, radio frequency (RF) sputtering, magnetron sputtering, and ionized metal plasma (IMP) sputtering. Following the formation of the material of the gate electrode 52a, 52b, a planarization process may be applied to the upper surface of the common gate 50 to provide that the upper surface of the interlevel dielectric layer 60 and the common gate 50 are coplanar.

Having described preferred embodiments of a methods and structures disclosed herein, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A memory device comprising:
   a bilayer nanosheet channel layer including a first layer composed of a silicon containing material and a second layer of a germanium containing material;
   a common gate structure for biasing each of the first layer and the second layer of the bilayer nanosheet channel layer to provide one of the first layer and the second layer is biased in accumulation and one of the first layer and the second layer biased in inversion; and
   a floating body region on a front face or rear face of the bilayer nanosheet channel layer.

2. The memory device of claim 1, wherein the silicon containing material is silicon, and the germanium containing material is silicon germanium.

3. The memory device of claim 1, wherein the first layer of the bilayer nanosheet channel layer has a thickness ranging from 1 nm to 50 nm, and the second layer of the bilayer nanosheet channel layer has a thickness ranging from 1 nm to 50 nm.

4. The memory device of claim 2, wherein an n-type or p-type epitaxial semiconductor material is present on opposing sides of the bilayer nanosheet channel layer.

5. The memory device of claim 4, wherein a supporting substrate is present underlying the bilayer nanosheet channel layer.

6. The memory device of claim 5, wherein the common gate structure includes a first portion atop the first layer of the silicon containing material, the first portion when viewed from a side cross section having a U-shaped geometry gate dielectric in direct contact with the first layer and an upper gate electrode in direct contact with the gate dielectric.

7. The memory device of claim 6, further comprising a gate sidewall spacer having a first portion overlying the bilayer nanosheet channel layer at an interface between the bilayer nanosheet channel layer and the n-type or p-type epitaxial semiconductor material and a second portion underlying the bilayer nanosheet channel layer.

8. The memory device of claim 6, wherein the common gate structure includes a second portion underlying the second layer of the germanium containing material, the second portion including a continuous conformal gate dielectric layer including portions present on the second layer of the germanium containing material, interior sidewalls of the gate sidewall spacer and the supporting substrate, the continuous conformal gate dielectric layer providing a rectangular geometry around a lower gate electrode.

9. The memory device of claim 8, wherein the memory device is a one transistor dynamic random access memory (1T-DRAM).

10. A memory device comprising:
    a bilayer nanosheet channel layer including a silicon (Si) layer and a silicon germanium (SiGe) layer;
    a common gate structure for biasing each of the silicon layer and the silicon germanium layer of the bilayer nanosheet channel to provide that the silicon germanium layer is biased in accumulation, and that the silicon layer is biased in inversion; and
    a floating body region on a front face or rear face of the bilayer nanosheet channel, the floating body region including a dielectric material in direct contact with a face edge of the bilayer nanosheet channel.

* * * * *